(12) United States Patent
Peng et al.

(10) Patent No.: US 12,744,189 B2
(45) Date of Patent: Sep. 22, 2026

(54) SEGMENTED GAS DISTRIBUTION PLATE FOR HIGH-POWER, HIGH-PRESSURE PROCESSES

(71) Applicant: LAM RESEARCH CORPORATION, Fremont, CA (US)

(72) Inventors: Gordon Peng, San Jose, CA (US); Mohammad Sohail Shaik, Andhra Pradesh (IN); Craig Rosslee, San Jose, CA (US); Dan Marohl, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 960 days.

(21) Appl. No.: 17/795,188

(22) PCT Filed: Jan. 26, 2021

(86) PCT No.: PCT/US2021/014988
§ 371 (c)(1),
(2) Date: Jul. 25, 2022

(87) PCT Pub. No.: WO2021/154673
PCT Pub. Date: Aug. 5, 2021

(65) Prior Publication Data

US 2022/0375725 A1 Nov. 24, 2022

Related U.S. Application Data

(60) Provisional application No. 62/966,816, filed on Jan. 28, 2020.

(51) Int. Cl.
*H01J 37/32* (2006.01)
*H10P 72/00* (2026.01)

(52) U.S. Cl.
CPC ... *H01J 37/32449* (2013.01); *H01J 37/32119* (2013.01); *H10P 72/0418* (2026.01)

(58) Field of Classification Search
CPC ........... H01J 37/32449; H01J 37/32119; H01J 37/3244; H01J 2237/334; H01L 21/67063
(Continued)

(56) References Cited

U.S. PATENT DOCUMENTS 4,590,042 A * 5/1986 Drage ................. H01J 37/3244 422/186.04
5,746,875 A * 5/1998 Maydan ............ C23C 16/45574 118/723 R
(Continued)

FOREIGN PATENT DOCUMENTS

CN 109075024 A 12/2018
JP H6302519 A 10/1994
(Continued)

OTHER PUBLICATIONS

International Search Report and Written Opinion of the ISA issued in PCT/US2021/014988, mailed May 17, 2021; ISA/KR.
(Continued)

*Primary Examiner* — Rudy Zervigon

(57) ABSTRACT

A gas distribution plate for a substrate processing system includes an outer ring including a stepped interface on a radially inner surface thereof and N inner rings, where N is an integer greater than zero. At least one of the N inner rings is circumferentially segmented and includes an inner stepped interface and an outer stepped interface. An outer stepped interface of a radially outer one of the N inner rings is configured to rest on and mate with the inner stepped interface of the outer ring. A center portion includes an outer stepped interface on a radially outer surface thereof that is
(Continued)

configured to rest on and mate with an inner stepped interface of a radially inner one of the N inner rings.

28 Claims, 9 Drawing Sheets

(58) Field of Classification Search
USPC ........... 118/715, 723, 1, 723 IR; 156/345.33, 156/345.34, 345.48, 345.49
See application file for complete search history.

(56) References Cited

U.S. PATENT DOCUMENTS

| | | | | |
|---|---|---|---|---|
| 5,800,621 | A * | 9/1998 | Redeker | H01J 37/321 118/723 AN |
| 6,245,192 | B1 * | 6/2001 | Dhindsa | C23C 16/45572 438/731 |
| 9,245,716 | B2 * | 1/2016 | de la Llera | H01J 37/32559 |
| 9,515,633 | B1 | 12/2016 | Long et al. | |
| 10,699,882 | B2 | 6/2020 | Suemitsu et al. | |
| 2007/0084406 | A1 * | 4/2007 | Yudovsky | H01L 21/67109 156/345.31 |
| 2007/0084408 | A1 * | 4/2007 | Yudovsky | H01L 21/67109 118/725 |
| 2007/0128864 | A1 | 6/2007 | Ma et al. | |
| 2009/0159002 | A1 | 6/2009 | Bera et al. | |
| 2015/0318147 | A1 | 11/2015 | Kang et al. | |
| 2016/0155616 | A1 | 6/2016 | Lee et al. | |
| 2018/0096843 | A1 | 4/2018 | Kulshreshtha et al. | |
| 2019/0385816 | A1 * | 12/2019 | Hsu | H01J 37/3211 |

FOREIGN PATENT DOCUMENTS

| | | | |
|---|---|---|---|
| JP | 2012216744 | A | 11/2012 |
| JP | 2014523635 | A | 9/2014 |
| JP | 201888336 | A | 6/2018 |
| JP | 2019145397 | A | 8/2019 |
| JP | 2019220532 | A | 12/2019 |
| KR | 20060101479 | A | 9/2006 |
| KR | 20140121372 | A | 10/2014 |
| KR | 1020160066340 | A | 6/2016 |
| KR | 20160086770 | A | 7/2016 |
| KR | 20170127358 | A | 11/2017 |
| TW | 412779 | B | 11/2000 |
| TW | 201528310 | A | 7/2015 |
| WO | WO-2008048543 | A1 | 4/2008 |

OTHER PUBLICATIONS

Office Action issued in Corresponding Korean Patent App. No. 1020227028460 mailed on Mar. 7, 2025.
Allowance issued in Corresponding Japanese Patent App. No. 2022545782 dated Sep. 24, 2024.
Office Action issued in Corresponding Taiwanese Patent App. No. 110102992 dated Nov. 5, 2024.
Office Action issued in corresponding Japanese Patent Application No. 2024-188692 dated Dec. 17, 2025.

* cited by examiner 110
111
112
113
Tuning Circuit
115
Reversing Circuit
116
Coil(s)
120
121
123
124
125
127
128
Plasma
132
134
140
Substrate Support
170
150
152
Bias Matching Circuit
154
Controller
156
157
Gas
Gas
Gas
158
Valves and FRC
159
Manifold
164
Heater/ Cooler
165
166
Valve
167
Pump
Exhaust
168
Temperature Controller 406
220
408
410
414
416
418
422
423
426
427
430
440

230
506
508
510
514
516
518
522
523
526
527
528
530
532
540

240
606
608
610
614
616
618
622
623
626
627
630
640
250
708
710
714
722
724

SEGMENTED GAS DISTRIBUTION PLATE FOR HIGH-POWER, HIGH-PRESSURE PROCESSES

CROSS-REFERENCE TO RELATED APPLICATIONS

This application is a U.S. National Phase Application under 35 U.S.C. 371 of International Application No. PCT/US2021/014988, filed on Jan. 26, 2021, which claims the benefit of U.S. Provisional Application No. 62/966,816, filed on Jan. 28, 2020. The entire disclosures of the applications referenced above are incorporated herein by reference.

FIELD

The present disclosure relates to substrate processing systems and more particularly to radially and circumferentially segmented gas distribution plates for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch film on substrates such as a semiconductor wafers. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

Current microelectromechanical (MEMs) processes may be performed in substrate processing systems using transformer coupled plasma (TCP). In these substrate processing systems, one or more coils are arranged outside of the chamber. A window is arranged between the coil and the chamber. A gas mixture is supplied to the chamber. RF power is supplied to the coils, which generates a magnetic field and strikes and maintains RF plasma in the chamber.

Plasma processing is power-limited due to high thermal gradients that are introduced, which can lead to window breakage. The window should be made of an inert, RF-transparent material having low dielectric loss properties. In addition, the window should not erode in response to typical etch chemistries (e.g. gas mixtures including halogen species such as fluorine, chlorine, etc.). The window should also not outgas undesirable byproducts in response to thermal and/or pressure cycling.

Given the above criteria, material selection for the window is generally limited to oxide ceramics, quartz, and some nitride ceramics. Downsides to oxide ceramics include high thermal insulation properties coupled with relatively high coefficients of thermal expansion. When oxide ceramics are subjected to severe thermal gradients and/or shock, they are prone to catastrophic breakage. As compared to oxide ceramics, quartz has higher dimensional stability due to a low coefficient of thermal expansion (CTE). However, quartz is silicon-based and therefore erodes very quickly, which makes the use of quartz cost prohibitive. Aluminum nitride provides sufficient performance but has extremely high cost and relatively few suppliers are capable of producing large diameter blanks that are required.

SUMMARY

A gas distribution plate for a substrate processing system includes an outer ring including a stepped interface on a radially inner surface thereof and N inner rings, where N is an integer greater than zero. At least one of the N inner rings is circumferentially segmented and includes an inner stepped interface and an outer stepped interface. An outer stepped interface of a radially outer one of the N inner rings is configured to rest on and mate with the inner stepped interface of the outer ring. A center portion includes an outer stepped interface on a radially outer surface thereof that is configured to rest on and mate with an inner stepped interface of a radially inner one of the N inner rings.

In other features, at least one of the N inner rings includes a plurality of gas through holes. Each of the N inner rings includes C circumferential portions, where C is an integer greater than one. Each of the C circumferential portions includes a body having a first arcuate portion and a second arcuate portion. The first arcuate portion is radially and circumferentially offset relative to the second arcuate portion.

In other features, the first arcuate portion has an inner diameter and an outer diameter. The second arcuate portion has an inner diameter and an outer diameter. The inner diameter of the first arcuate portion is greater than the inner diameter of the second arcuate portion and less than the outer diameter of the second arcuate portion. The outer ring, the N inner rings, and the center portion are made of a material that is RF transparent.

In other features, the outer ring, the N inner rings, and the center portion are made of alumina. In other features, the outer ring, the N inner rings, and the center portion are made of aluminum nitride. In other features, the outer ring is made of alumina and the N inner rings and the center portion are made of aluminum nitride.

In other features, interfacing surfaces of the outer ring, the N inner rings and the center portion are polished. In other features, the second arcuate portion of a first one of the C circumferential portions lies below the first arcuate portion of the first one of the C circumferential portions. The second arcuate portion of the first one of the C circumferential portions includes a slot defining a plenum surrounding gas through holes. The slot is located on a cantilevered section of the second arcuate portion extending from the second arcuate portion of the first one of the C circumferential portions.

In other features, the gas distribution plate further includes gas through holes on a first arcuate portion of a second one of the C circumferential portions, wherein the gas through holes of the first arcuate portion of the second one of the C circumferential portions align with the gas through holes of the second arcuate portion of the first one of the C circumferential portions when assembled.

In other features, when nested together, the outer ring, the N inner rings and the central portion define planar upper and lower surfaces.

A substrate processing system includes a processing chamber including a substrate support. A coil is arranged outside of the processing chamber. The gas distribution plate is arranged between the processing chamber and the coil.

In other features, at least one of the N inner rings includes a plurality of through holes. Each of the N inner rings includes C circumferential portions, where C is an integer greater than one. Each of the C circumferential portions includes a body having a first arcuate portion and a second arcuate portion, wherein the first arcuate portion is radially and circumferentially offset relative the second arcuate portion.

In other features, a gas distribution assembly is provided and includes a top plate and the gas distribution plate. The top plate is disposed on the gas distribution plate. A gap exists between the top plate and the gas distribution plate for passage of gas to holes in one or more of the N inner rings.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Microelectromechanical (MEMs) devices are currently produced using high etch rate processes with high gas flows and pressures, high RF power, and high process temperatures. To achieve acceptable uniformity while sustaining high etch rates, MEMS processes are highly sensitive to the location and uniformity of gas distribution. As a result, some MEMs devices are produced using substrate processing systems with TCP plasma.

The examples set forth herein include gas distribution assemblies that include top plates and segmented gas distribution plates. The top plates and gas distribution plates perform as windows that are RF transparent to allow generated RF signals to pass therethrough to a processing chamber. Each of the segmented gas distribution plates according to the present disclosure is a ring assembly and includes multiple rings, where each ring may include one or more ring segments. Examples of different ring assemblies are shown in FIGS. 1-10. At least some of the rings may be radially and/or circumferentially segmented. The ring segments interlock from the outside using cascading steps. In some examples, the ring segments have polished contact surfaces to reduce particle generation and create an indirect path to discourage indeterminate gas flow. In some examples, the ring segments are made of alumina ($Al_2O_3$), although other materials can be used, such as aluminum nitride (AlN). The segmented gas distribution plates can be used in higher temperatures, in higher power settings, and experience higher pressures as compared to non-segmented gas distribution plates made of similar materials. Gaps exist between the ring segments to allow for expansion, reduce stress, and prevent damage to the ring segments.

The ring segments formed of AlN have improved thermal conductivity and coefficients of thermal expansion over ring segments formed of $Al_2O_3$. As a result, the corresponding ring assembly including the ring segments formed of AlN experiences smaller temperature gradients, less stress for a given operating temperature gradient, and thus has a more durable structure. In some embodiments, one or more of the ring segments of a ring assembly is formed of $Al_2O_3$ and one or more other ring segments is formed of AlN. In one embodiment, a radially outermost one or more ring segments is formed of $Al_2O_3$ and a radially innermost one or more ring segments is formed of AlN.

Segmenting the gas distribution plates radially and circumferentially provides expansion gaps between cascading segments, diverting and displacing thermal energy as opposed to creating stress points, where cracking can occur. Radial portions of the segments may include landings for through-holes to control gas delivery zones, while the outermost ring segments of an outermost ring may include grooves for o-ring sealing for vacuum integrity.

Figure 1:
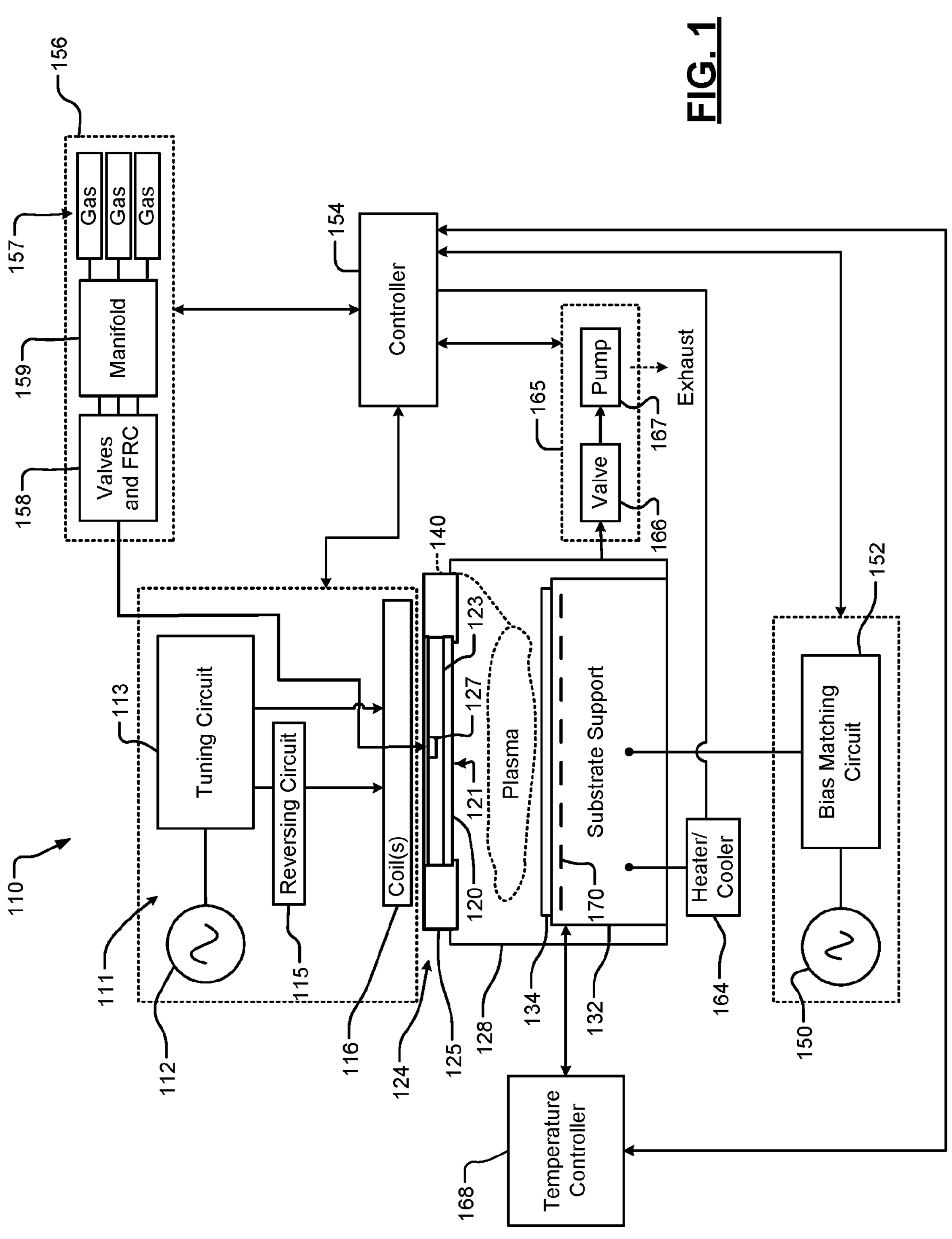
FIG. 1 is a functional block diagram of an example of a substrate processing system including a gas distribution assembly according to the present disclosure.

Referring now to FIG. 1, an example of a substrate processing system 110 according to the present disclosure is shown. The substrate processing system 110 includes a coil driving circuit 111. As shown, the coil driving circuit 111 includes an RF source 112 and a tuning circuit 113. The tuning circuit 113 may be directly connected to one or more inductive transformer coupled plasma (TCP) coils 116. Alternatively, the tuning circuit 113 may be connected by an optional reversing circuit 115 to one or more of the TCP coils 116.

The tuning circuit 113 tunes an output of the RF source 112 to a desired frequency and/or a desired phase, matches an impedance of the TCP coils 116 and splits power between the TCP coils 116. The reversing circuit 115 is used to selectively switch the polarity of current through one or more of the TCP coils 116. In some examples, the coil driving circuit 111 implements a transformer coupled capacitive tuning (TCCT) match network to drive the TCP coils 116. For example, processing chambers using a TCCT match network with switched capacitors are shown and described in commonly-assigned U.S. Pat. No. 9,515,633, which is hereby incorporated by reference in its entirety.

A top portion 124 of a processing chamber 128 includes a gas distribution assembly 121 that includes a top plate 123 and a segmented gas distribution plate 120 with gas through holes (shown in FIG. 2 below). A radially outermost portion of the gas distribution assembly 121 may be supported by a portion of a chamber wall, or a retainer 125, as shown. A gas plenum 127 is arranged above the segmented gas distribution plate 120 in the top plate 123. The top plate 123 and the gas distribution plate 120 are arranged between the TCP coils 116 and the processing chamber 128. In some examples, process gases are supplied to the gas plenum 127 using a gas nozzle, gas valves, disbursement plate, conduit, etc. The processing chamber 128 further comprises a substrate support (or pedestal) 132. The substrate support 132 may include an electrostatic chuck (ESC), or a mechanical chuck or other type of chuck.

Process gas is supplied to the processing chamber 128 via gas distribution assembly 121. Gas received at the plenum 127 is distributed to holes in the segmented gas distribution plate 120. RF power is supplied to the TCP coils 116. Plasma 140 is generated and maintained inside of the processing chamber 128. For example, a magnetic field generated by the TCP coils 116 travels through the top plate 123 into the processing chamber 128. The magnetic field excites gas molecules within the processing chamber 128 to generate plasma 140. The plasma 140 may be used to treat (etching, deposition, cleaning, etc.) an exposed surface of the substrate 134. An RF source 150 and a bias matching circuit 152 may be used to bias the substrate support 132 during operation to control ion energy. As an example, the TCP coils 116 may include a radially disposed inner coil and a radially disposed outer coil that surrounds the inner coil.

A gas delivery system 156 may be used to supply a process gas mixture to the processing chamber 128. The gas delivery system 156 may include process and inert gas sources 157 (e.g., including deposition gases, etch gases, carrier gases, inert gases, etc.), gas metering system 158 such as valves and flow controllers (e.g., mass flow controllers (MFCs), and manifold 159. For example, the gas metering system 158 and the manifold 159 may be arranged to provide etch gas mixtures to the processing chamber 128 during etching.

A heater/cooler 164 may be used to heat/cool the substrate support 132 to a predetermined temperature. An exhaust system 165 includes a valve 166 and pump 167 to remove reactants from the processing chamber 128 by purging or evacuation.

A controller 154 may be used to control the etching process. The controller 154 monitors system parameters and controls delivery of the gas mixture, striking, maintaining and extinguishing the plasma, removal of reactants, and so on.

Additionally, the controller 154 may control various aspects of the coil driving circuit 111, the RF source 150, and the bias matching circuit 152, etc. In some examples, the substrate support 132 is temperature-tunable. In one example, a temperature controller 168 may be connected to a plurality of heating elements 170, such as thermal control elements (TCEs), arranged in the substrate support 132. The temperature controller 168 may be used to control the plurality of heating elements 170 to control a temperature of the substrate support 132 and the substrate 134.

Figure 2:
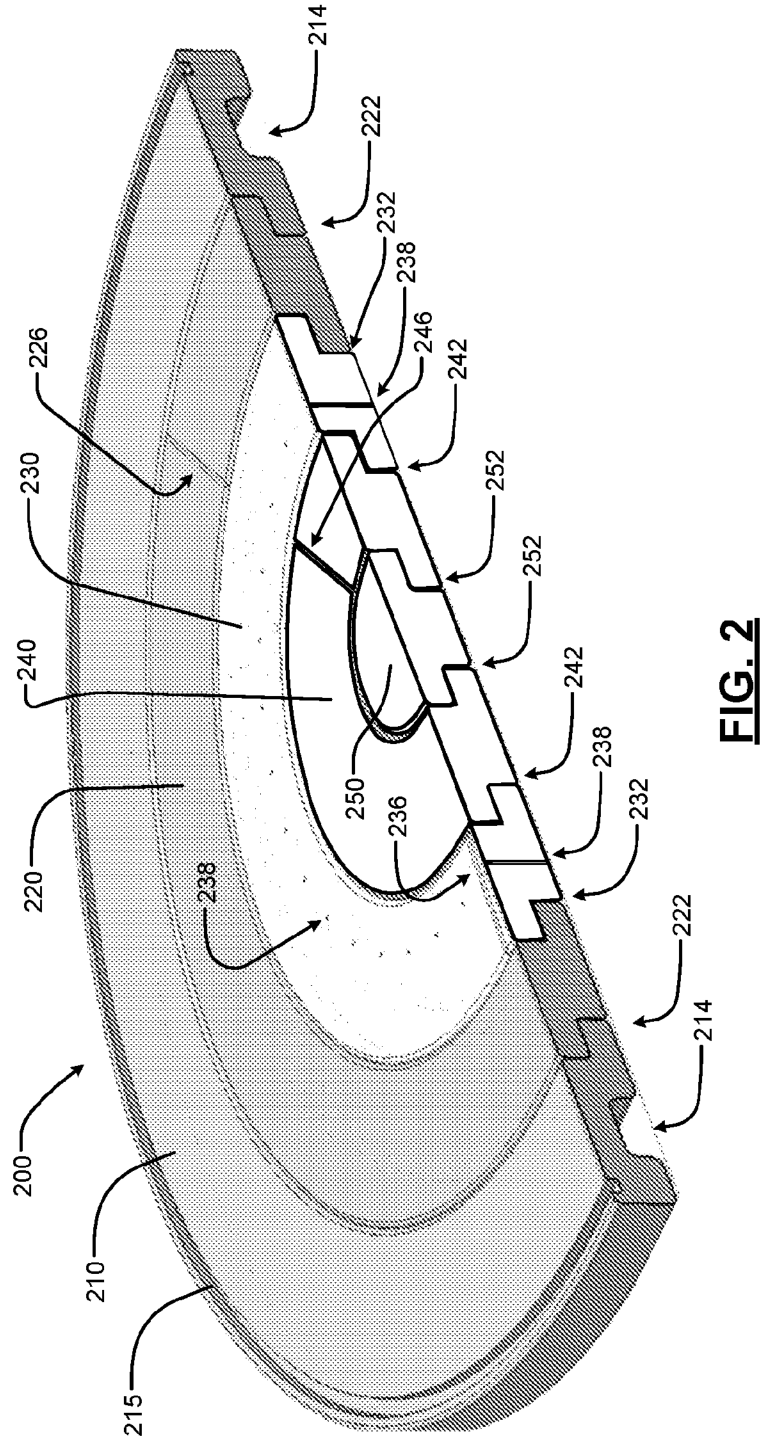
FIG. 2 is a cross-sectional, perspective view of a radially and circumferentially segmented gas distribution plate including a stepped outer ring and one or more segmented and stepped inner rings according to the present disclosure.

Referring now to FIG. 2, a segmented gas distribution plate 200 includes a plurality of nested ring segments at least some of which are radially and/or circumferentially segmented. The segmented gas distribution plate 200 may replace the segmented gas distribution plate 120 of FIG. 1. The segmented gas distribution plate 200 includes an outer ring 210. In some examples, the outer ring 210 includes an annular slot 214 that extends partially or fully around a lower surface of the outer ring 210. One or more additional annular slots 214 can be arranged at spaced radial locations on the lower surface of outer ring 210. The annular slots may be included and perform as thermal chokes to limit thermal energy transfer in adjacent areas. In some embodiments, the annular slots 214 are not included, such as the embodiment of FIGS. 8-10.

In some examples, one or more annular slots (or grooves) 215 can be located on an upper surface of the outer ring 210. The slots 215 may include an o-ring to provide a vacuum tight seal between the segmented gas distribution plate 200 and a top plate, such as the top plate 123 of FIG. 1.

A first stepped inner ring 220 is arranged radially inside of and mates with the outer ring 210. The first stepped inner ring 220 rests on a stepped interface 222 that is defined therebetween. In some embodiments, the first stepped inner ring 220 is circumferentially segmented into two or more segments as shown at 226.

A second stepped inner ring 230 is arranged radially inside of and mates with the first stepped inner ring 220. The second stepped inner ring 230 rests on a stepped interface 232 therebetween. In some embodiments, the second stepped inner ring 230 is circumferentially segmented into two or more segments as shown at 236. The second stepped inner ring 230 may include one or more gas through holes 238 that extend from an upper surface to a lower surface thereof.

A third stepped inner ring 240 is arranged radially inside of and mates with the second stepped inner ring 230. The third stepped inner ring 240 rests on a stepped interface 242 therebetween. In some embodiments, the third stepped inner ring 240 is circumferentially segmented into two or more segments as shown at 246.

A center portion 250 is arranged radially inside of and mates with the third stepped inner ring 240. The center portion 250 rests on a stepped interface 252 therebetween. The center portion 250 is not circumferentially segmented. While a single stepped outer ring, three stepped inner rings and a center portion are shown, additional or fewer stepped inner rings may be used. While the second stepped inner ring 230 is shown to include gas through holes 238, the second stepped inner ring 230 may include additional through holes. In some examples, the first stepped inner ring, the third stepped inner ring and/or the center portion may also include gas through holes (not shown). In some examples, upper and lower surfaces of the segmented gas distribution plate 200 are generally planar (other than the annular slot 214).

Although the segmented gas distribution plate 200 is shown including three inner rings, the gas distribution plate 200 may include one or more inner rings. The segmented gas distribution plate 200 may be formed of $Al_2O_3$ and/or AlN. In one embodiment, the segmented gas distribution plate 200 is formed of $Al_2O_3$. In another embodiment, the segmented gas distribution plate 200 is formed of AlN. In yet another embodiment, the ring 210 is formed of $Al_2O_3$ and one or more of the inner rings (e.g., rings 220, 230, 240) and the center portion 250 are formed of AlN.

Figures 3A, 3B:
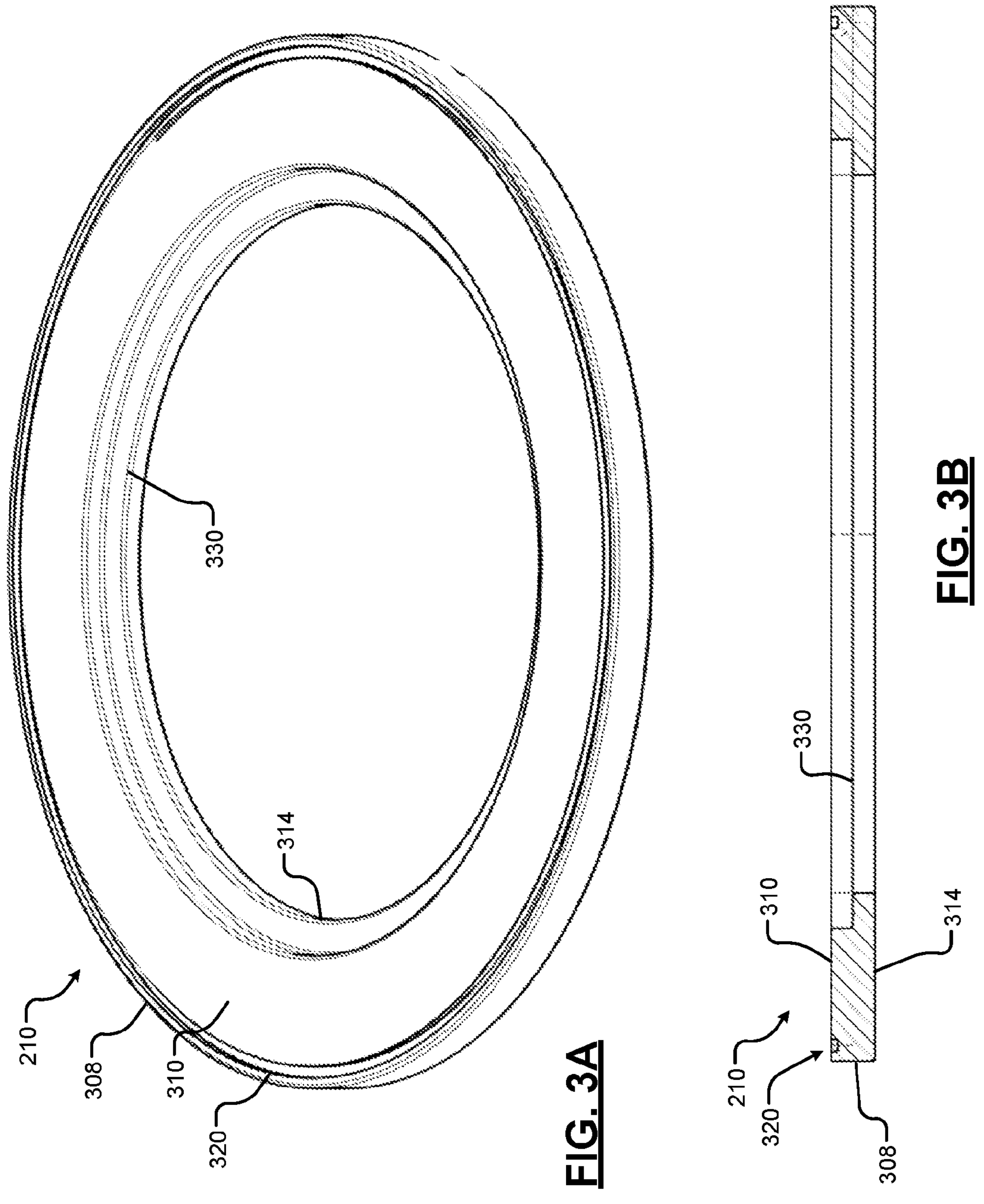
FIG. 3A is a perspective view of an upper surface of the outer ring according to the present disclosure.
FIG. 3B is a cross-sectional side view of the outer ring according to the present disclosure.

Referring now to FIGS. 3A and 3B, the outer ring 210 of FIG. 2 is shown in further detail. The outer ring 210 includes an annular body 308 having a flat, annular ring shape. The annular body 308 includes an upper surface 310 and a lower surface 314. The outer ring 210 further includes an annular slot 320 located on the upper surface 310. A radially inner surface of the outer ring 210 defines a stepped interface 330. In other words, the lower surface 314 extends radially inwardly relative to the upper surface 310 to form a step. In some examples, the first stepped inner ring 220 rests on the stepped interface 330.

Figures 4A, 4B, 4C:
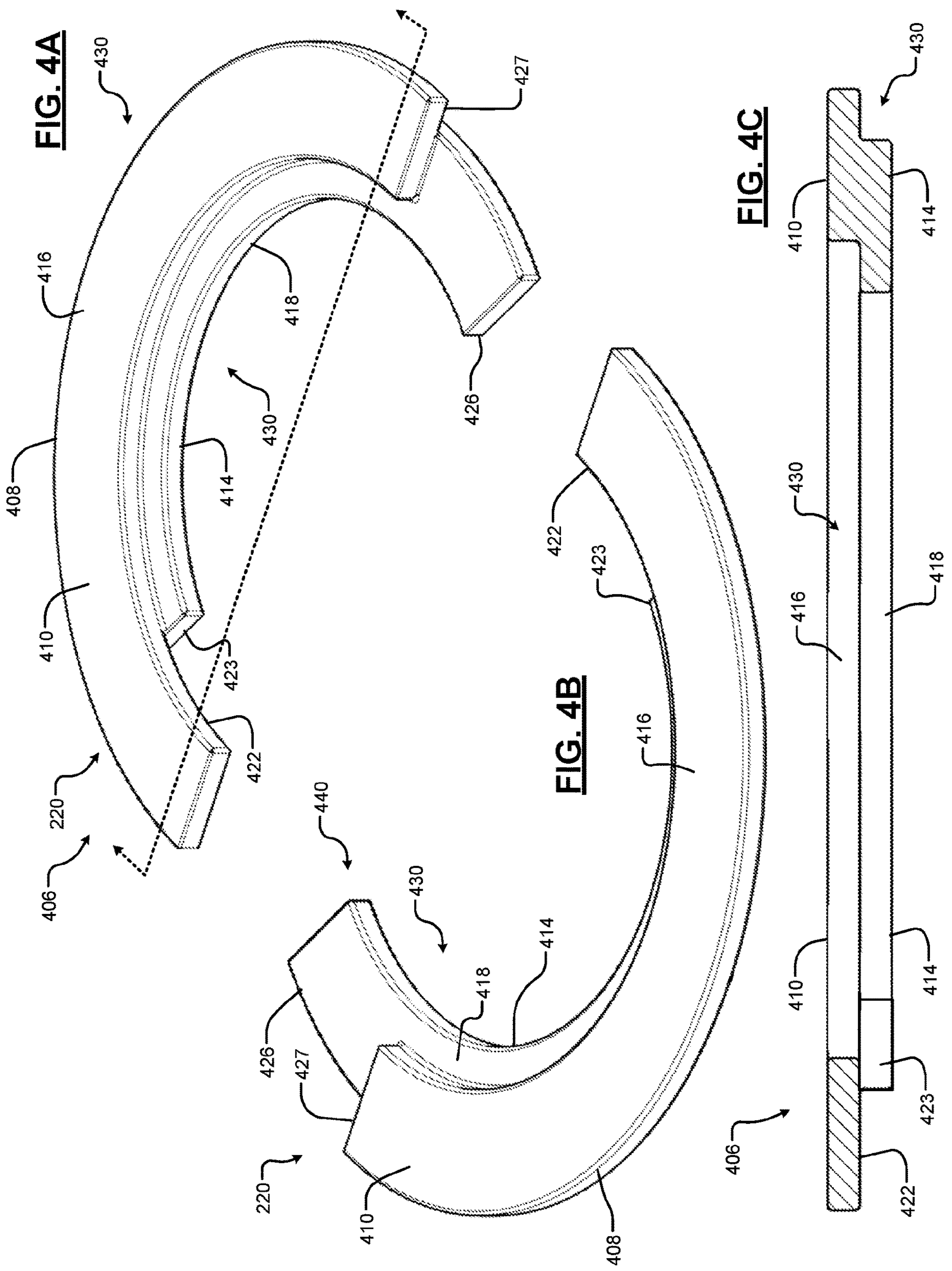
FIG. 4A is a perspective view of an upper surface of a first portion of a first segmented and stepped inner ring according to the present disclosure.
FIG. 4B is a perspective view of an upper surface of a second portion of the first segmented and stepped inner ring according to the present disclosure.
FIG. 4C is a cross-sectional side view of the first portion of the first segmented and stepped inner ring according to the present disclosure.

Referring now to FIGS. 4A to 4C, the first stepped inner ring 220 of FIG. 2 is shown in further detail. In FIG. 4A, the first stepped inner ring 220 is both radially and circumferentially segmented. While the first stepped inner ring 220 is shown with two circumferential segments, additional circumferential segments may be used.

The first stepped inner ring 220 includes a first circumferential portion 406 including a body 408 having an upper surface 410 and a lower surface 414. The body 408 includes a first arcuate portion 416 that is rotated with respect to a second arcuate portion 418. In other words, the first arcuate portion 416 and the second arcuate portion 418 have similar but offset arcuate lengths. In some examples, the first arcuate portion 416 and the second arcuate portion 418 have similar thicknesses in a radial direction. In some examples, an inner diameter of the first arcuate portion 416 is greater than an inner diameter of the second arcuate portion 418 and less than an outer diameter of the second arcuate portion 418. In some examples, the first arcuate portion 416 and the second arcuate portion 418 are made of a single, monolithic material. In other examples, the first arcuate portion 416 and the second arcuate portion 418 are made separately and then attached or bonded together.

An end 422 of the first arcuate portion 416 extends circumferentially relative to a corresponding end 423 of the second arcuate portion 418. Likewise, an end 426 of the second arcuate portion 418 extends circumferentially relative to a corresponding end 427 of the first arcuate portion 416. In FIG. 4B, the first stepped inner ring 220 includes a second circumferential portion 440 that is similar to the first circumferential portion 406. The first arcuate portion 416 and the second arcuate portion 418 define inner and outer stepped interfaces 430.

Figures 5A, 5B, 5C:
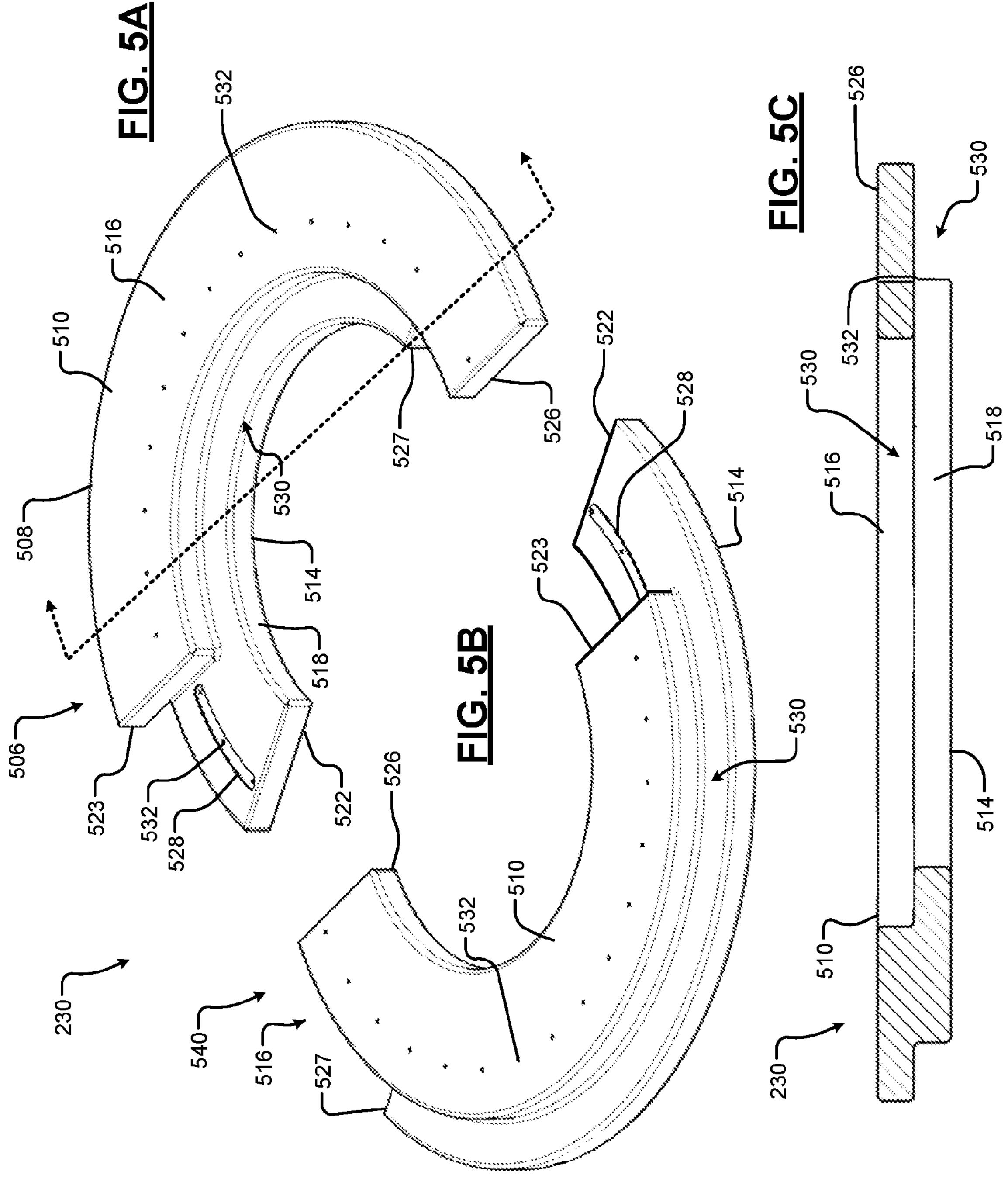
FIG. 5A is a perspective view of an upper surface of a first portion of a second segmented and stepped inner ring according to the present disclosure.
FIG. 5B is a perspective view of a lower surface of the first portion of the second segmented and stepped inner ring according to the present disclosure.
FIG. 5C is a cross-sectional side view of the first portion of the second segmented and stepped inner ring according to the present disclosure.

Referring now to FIGS. 5A to 5C, the second stepped inner ring 230 of FIG. 2 is shown in further detail. In FIG. 5A, the second stepped inner ring 230 is both radially and circumferentially segmented. While the second stepped inner ring 230 is shown with two circumferential segments, additional circumferential segments may be used.

The second stepped inner ring 230 includes a first circumferential portion 506 including a body 508 having an upper surface 510 and a lower surface 514. The body 508 defines a first arcuate portion 516 that is rotated with respect to a second arcuate portion 518. In other words, the first arcuate portion 516 and the second arcuate portion 518 have similar but offset arcuate lengths. In some examples, the first arcuate portion 516 and the second arcuate portion 518 have similar thicknesses in a radial direction. In some examples, an inner diameter of the first arcuate portion 516 is greater than an inner diameter of the second arcuate portion 518 and less than an outer diameter of the second arcuate portion 518.

An end 522 of the second arcuate portion 518 extends circumferentially relative to a corresponding end 523 of the first arcuate portion 516. Likewise, an end 526 of the first arcuate portion 516 extends circumferentially relative to a corresponding end 527 of the second arcuate portion 518. The first arcuate portion 516 and the second arcuate portion 518 define inner and outer stepped interfaces 530.

The second stepped inner ring 230 includes a plurality of through holes 532. One or both of the ends 522 and 526 (cantilevered sections thereof) may include a slot 528 defining a plenum around one or more of the through holes 532. In FIG. 5B, the second stepped inner ring 230 includes a second circumferential portion 540 (shown inverted) that is similar to the first circumferential portion 506.

Figures 6A, 6B, 7A, 7B:
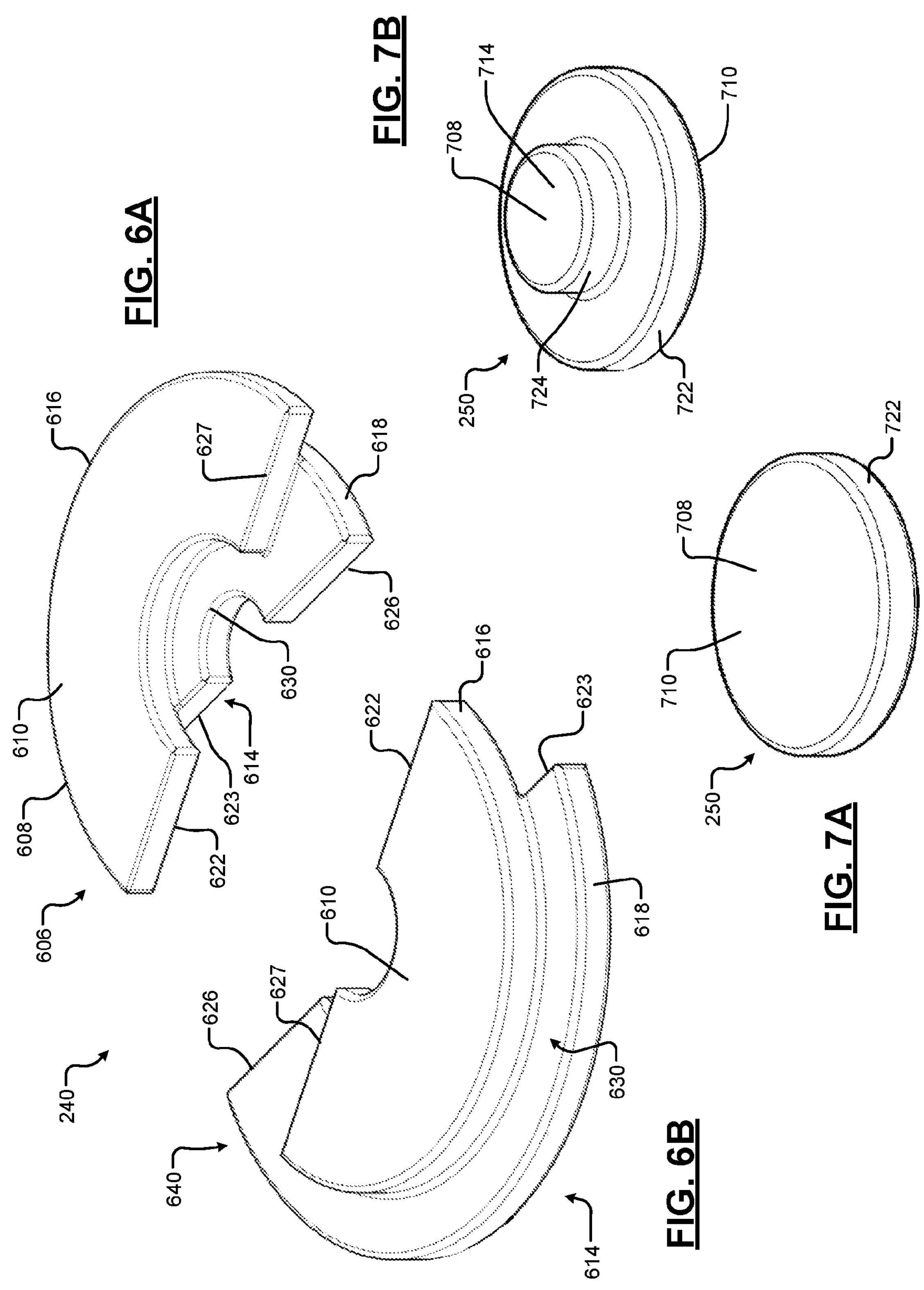
FIG. 6A is a perspective view of an upper surface of a first portion of a third segmented and stepped inner ring according to the present disclosure.
FIG. 6B is a perspective view of a lower surface of the first portion of the third segmented and stepped inner ring according to the present disclosure.
FIG. 7A is a perspective view of an upper surface of a first portion of a fourth stepped inner ring according to the present disclosure.
FIG. 7B is a perspective view of a lower surface of the first portion of the fourth stepped inner ring according to the present disclosure.

Referring now to FIGS. 6A to 6B, the third stepped inner ring 240 of FIG. 2 is shown in further detail. In FIG. 6A, the third stepped inner ring 240 is both radially and circumferentially segmented. While the third stepped inner ring 240 is shown with two circumferential segments, additional circumferential segments may be used.

The third stepped inner ring 240 includes a first circumferential portion 606 including a body 608 having an upper surface 610 and a lower surface 614. The body 608 defines a first arcuate portion 616 that is rotated with respect to a second arcuate portion 618.

The body 608 defines a first arcuate portion 616 that is rotated with respect to a second arcuate portion 618. In other words, the first arcuate portion 616 and the second arcuate portion 618 have similar but offset arcuate lengths. In some examples, the first arcuate portion 616 and the second arcuate portion 618 have similar thicknesses in a radial direction. In some examples, an inner diameter of the first arcuate portion 616 is greater than an inner diameter of the second arcuate portion 618 and less than an outer diameter of the second arcuate portion 618.

An end 622 of the first arcuate portion 616 extends circumferentially relative to a corresponding end 623 of the second arcuate portion 618. An end 626 of the second arcuate portion 618 extends circumferentially relative to a corresponding end 627 of the first arcuate portion 616. In FIG. 6B, the second stepped inner ring 230 includes a second circumferential portion 640 (shown inverted) that is similar to the first circumferential portion 606. The first arcuate portion 616 and the second arcuate portion 618 define inner and outer stepped interfaces 630.

Referring now to FIGS. 7A to 7B, the center portion 250 of FIG. 2 is shown in further detail. The center portion 250 includes a body 708 having an upper surface 710 and a lower surface 714. An upper portion 722 of the body 708 has a cylindrical shape and a first diameter. A lower portion 724 of the body 708 has a cylindrical shape and a second diameter that is less than the first diameter.

Figure 8:
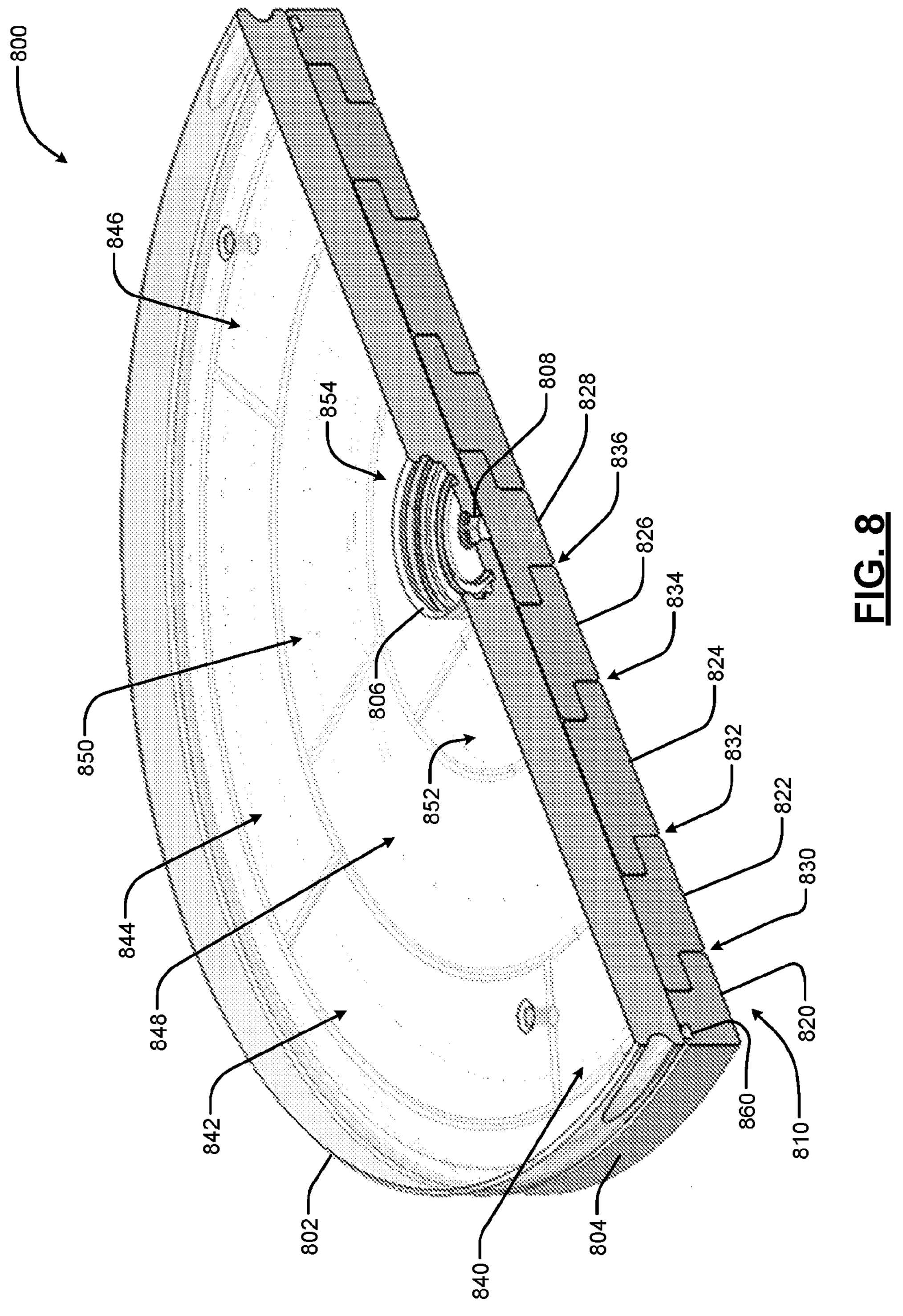
FIG. 8 shows a cross-sectional perspective view of another gas distribution assembly including a top plate and a segmented gas distribution plate according to the present disclosure.

FIG. 8 shows gas distribution assembly 800 including a top plate 802 and a segmented gas distribution plate 804. The gas distribution assembly 800 may replace the gas distribution assembly 121 of FIG. 1. The top plate 802 includes a centrally located plenum 806 for receiving gas, which has a center hole 808. Gas is received at the plenum 806 directed through the center hole 808 and distributed between the top plate 802 and the segmented gas distribution plate 804 to one or more rings 810 of the segmented gas distribution plate 804.

The rings 810 may include a support ring 820, one or more inner (or intermediate) rings (as an example three intermediate rings 822, 824, 826 are shown) and a center portion (or stepped circular-shaped plug) 828. Stepped interfaces 830, 832, 834 exist between the rings 820, 822, 824, 826. Stepped interface 836 exists between the ring 826 and the center portion 828. The ring 820 supports the ring 822, which in turn supports the ring 824. The ring 824 supports the ring 826, which in turn supports the center portion 828. Each of the intermediate rings may be segmented and include ring segments, example ring segments 840, 842, 844, 846, 848, 850, 852, 854 are shown for the rings 822, 824, 826. The ring segments 840, 842, 844, 846, 848, 850, 852, 854 are shown as being visible through the top plate 802 in FIG. 8, but in actuality are not visible though the top plate 802.

The ring 820 does not include an annular slot (such as slot 214 of FIG. 2), but does include an annular groove 860 in which an O-ring (not shown) can be disposed within to provide an annular vacuum seal between the top plate 802 and the segmented gas distribution plate 804.

The top plate 802 and the segmented gas distribution plate 804 may be formed of $Al_2O_3$ and/or (AlN). In one embodiment, the top plate 802 and the segmented gas distribution plate 804 are formed of $Al_2O_3$. In another embodiment, the top plate 802 and the segmented gas distribution plate 804 are formed of AlN. In yet another embodiment, the top plate 802 and the ring 820 are formed of $Al_2O_3$ and the one or more intermediate rings (e.g., rings 822, 824, 826) and the center portion 828 are formed of AlN.

Figure 9:
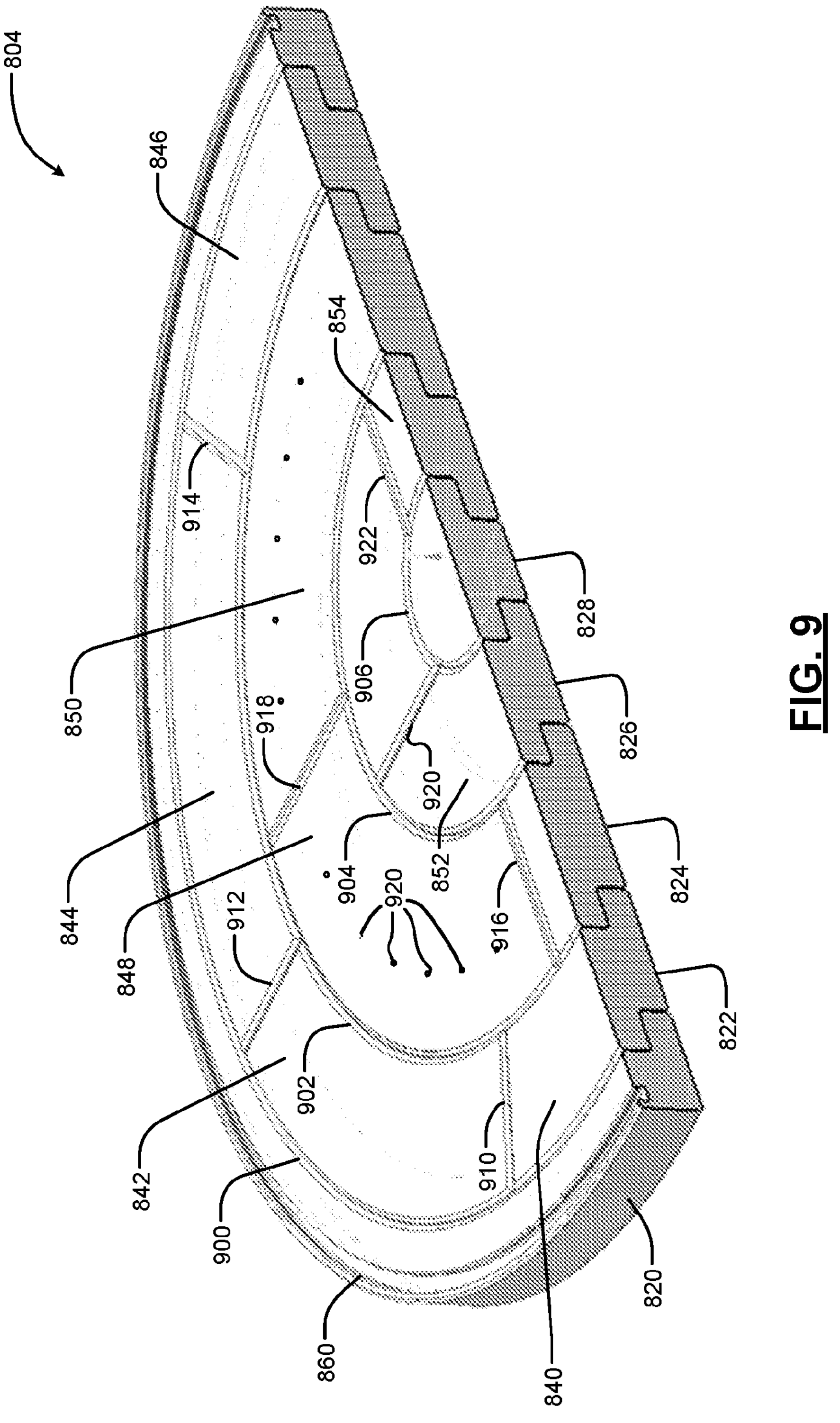
FIG. 9 shows a cross-sectional perspective view of the segmented gas distribution plate of FIG. 8.

The gas distribution assembly 800 is further described below with respect to FIGS. 9-10. FIG. 9 shows the segmented gas distribution plate 804. The segmented gas distribution plate 804 includes the rings 820, 822, 824, 826 and center portion 828. The ring 820 includes the annular groove 860. The rings 820, 822, 824, 826 include ring segments, such as the ring segments 840, 842, 844, 846, 848, 850, 852, 854. Circular-shaped interfaces 900, 902, 904 are shown between the rings 820, 822, 824, 826. A circular-shaped interface 906 is shown between the ring 826 and the center portion 828. Radially extending interfaces 910, 912, 914, 916, 918, 920, 922 are shown between ring segments of rings 822, 824, 826.

The ring segments 848, 850 and other ring segments of the intermediate ring 824 may include gas holes 920, some of which are shown. Although the ring segments of the intermediate ring 824 are shown as having gas holes, the ring segments of the rings 822, 826 may include gas holes. Gas is received at the holes and passed into a corresponding processing chamber.

Figure 10:
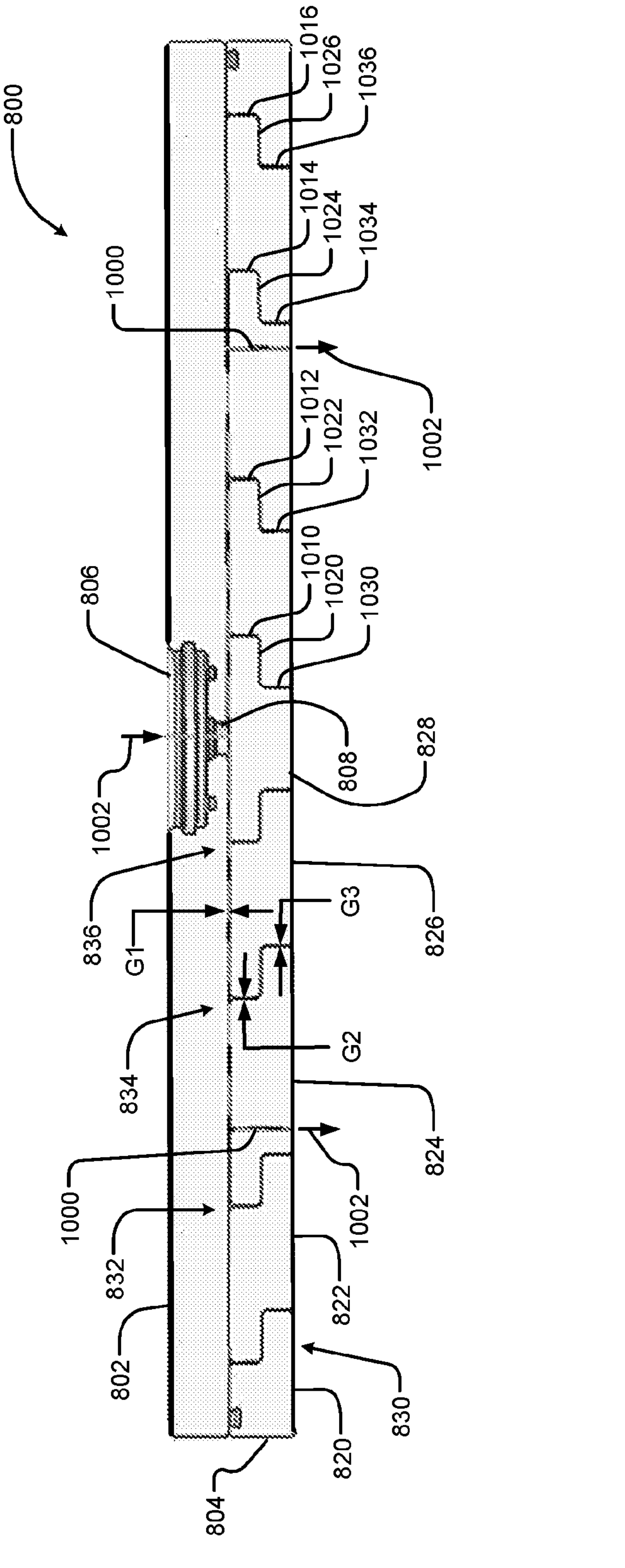
FIG. 10 shows a cross-sectional view of the gas distribution assembly illustrating gas flow and gaps between plates and adjacent and interlocking ring segments.

FIG. 10 shows the gas distribution assembly 800 illustrating gas flow and gaps between the plates 802, 804 and interlocking ring segments. The top plate 802 includes the plenum 806 and center hole 808. The segmented gas distribution plate 804 includes the rings 820, 822, 824, 826 and the center portion 828 including the annular interfaces 830, 832, 834, 836.

A nominal gap G1 exists between (i) the top plate 802 and (ii) the rings 824, 826 and the center portion 828. The gap G1 may be provided via a circular recessed portion of the top plate 802. In addition or as an alternative, the rings 824, 826 and the center portion 828 may be shorter than the rings 820, 822 to provide the gap G1. An area between the plates 802, 804 and associated with the gap G1 may extend laterally across the center portion 828, the ring 826, and a portion of the ring 824 radially inward and up to the holes 1000.

In the example shown, gas is received at the plenum 806, passed vertically through the hole 808, distributed radially within the gap G1 to holes (e.g., the holes 1000 or the holes 920 of FIG. 9) in the ring 824, and passed vertically through the holes into a processing chamber. This is illustrated by arrows 1002. In one embodiment, the gap G1 is between 0.011 inches (or approximately 0.28 millimeters) and 0.023 inches (or approximately 0.58 millimeters). In another embodiment, the gap G1 is equal to or about 0.017 inches (or approximately 0.43 millimeters). In the example shown, no gap exists between the ring 822 and the top plate 802, however a gap may exist if the ring 822 include gas holes.

The annular interfaces 830, 832, 834, 836 include respective upper vertical portions 1010, 1012, 1014, 1016, center horizontal portions, 1020, 1022, 1024, 1026, and lower vertical portions 1030, 1032, 1034, 1036. The upper vertical portions 1010, 1012, 1014, 1016 may have the same sized gap, referred to as G2 in FIG. 10. The lower vertical portions 1030, 1032, 1034, 1036 have the same sized gap, referred to as G3 in FIG. 10. Although G2 and G3 are shown only for the interface 824, the gaps of the vertical portions of the interfaces 830, 832, and 836 may also be designated G2 and G3. In one embodiment, the gaps G2, G3 are each between 0.010 inches (or approximately 0.25 millimeters) and 0.025 inches (or approximately 0.61 millimeters). In another embodiment, the gaps G2 and G3 are each equal to or about 0.013 inches (or approximately 0.33 millimeters). The gaps G2 and G3 of the vertical portions 1010, 1012, 1014, 1016, 1030, 1032, 1034, 1036 are provided to allow for expansion of the rings 820, 822, 824, 826 and the center portion 828. Each of the center horizontal portions, 1020, 1022, 1024, 1026 has no gap because the corresponding center portion or inner ring rests on the corresponding outer ring.

In one embodiment, mating surfaces of the rings 820, 822, 824, 826 and the center portion 828 associated with the annular interfaces 830, 832, 834, 836 are polished to provide gas seals. The gas seals are provided to prevent gas from passing between the rings 820, 822, 824, 826 and/or between the ring 826 and the center portion 828.

The segmented gas distribution plates are resistant to breakage due to extreme thermal inputs without resorting to compromising materials such as quartz or high cost materials such as nitride ceramics. The segmented gas distribution plates are passive, maintenance-free devices, and can be fabricated via conventional methods. Using a segmented gas distribution plate made of aluminum oxide reduces upfront cost as well as extend the lifetime of the gas distribution plate in the harsh process conditions. A segmented gas distribution plate made of aluminum nitride provides improved durability.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrases "at least one of A, B, and C" and "at least one of A, B, or C" should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A gas distribution assembly for a substrate processing system, the gas distribution assembly comprising:
- a top plate; and
- a gas distribution plate comprising
  - an outer ring including an inner stepped interface on a radially inner surface thereof,
  - N inner rings, wherein
    - N is an integer greater than zero,
    - at least one of the N inner rings is circumferentially segmented and includes an inner stepped interface and an outer stepped interface, and the outer stepped interface of a radially outer one of the N inner rings is configured to rest on and mate with the inner stepped interface of the outer ring, and a center portion including an outer stepped interface on a radially outer surface thereof that is configured to rest on and mate with the inner stepped interface of a radially inner one of the N inner rings, wherein the top plate and the gas distribution plate are dielectric windows, the top plate is disposed on the gas distribution plate, and a gap exists between the top plate and the gas distribution plate for passage of gas to a plurality of gas through holes in one or more of the N inner rings.

2. The gas distribution assembly of claim 1, wherein, when nested together, the outer ring, the N inner rings and the center portion define planar upper and lower surfaces.

3. The gas distribution assembly of claim 1, wherein N=2.

4. The gas distribution assembly of claim 1, wherein N=3.

5. The gas distribution assembly of claim 1, wherein:

each of the N inner rings is segmented includes C circumferential portions, where C is an integer greater than one; and each of the C circumferential portions includes a body having a first ring segment and a second ring segment, wherein the first ring segment is radially and circumferentially offset relative to the second ring segment.

6. The gas distribution assembly of claim 5, wherein C=2.

7. The gas distribution assembly of claim 5, wherein:

the first ring segment has an inner diameter and an outer diameter;

the second ring segment has an inner diameter and an outer diameter; and the inner diameter of the first ring segment is greater than the inner diameter of the second ring segment and less than the outer diameter of the second ring segment.

8. The gas distribution assembly of claim 5, wherein:

the second ring segment of a first one of the C circumferential portions lies below the first ring segment of the first one of the C circumferential portions;

the second ring segment of the first one of the C circumferential portions includes a slot defining a plenum surrounding first gas through holes; and the slot is located on a cantilevered section of the second ring segment extending from the second ring segment of the first one of the C circumferential portions; and the cantilevered section of the second ring segment of a first one of the C circumferential portions overlaps azimuthally with a third ring segment of a second one of the C circumferential portions.

9. The gas distribution assembly of claim 8, further comprising second gas through holes on a first ring segment of a second one of the C circumferential portions, wherein the second gas through holes of the first ring segment of the second one of the C circumferential portions align with the first gas through holes of the second ring segment of the first one of the C circumferential portions when assembled.

10. The gas distribution assembly of claim 1, wherein the outer ring, the N inner rings, and the center portion are made of a material that is RF transparent.

11. The gas distribution assembly of claim 1, wherein the outer ring, the N inner rings, and the center portion are made of alumina.

12. The gas distribution assembly of claim 1, wherein the outer ring, the N inner rings, and the center portion are made of aluminum nitride.

13. The gas distribution assembly of claim 1, wherein:

the outer ring is made of alumina; and the N inner rings and the center portion are made of aluminum nitride.

14. The gas distribution assembly of claim 1, wherein interfacing surfaces of the outer ring, the N inner rings and the center portion are polished.

15. A substrate processing system comprising:

a processing chamber including a substrate support;

a coil arranged outside of the processing chamber; and the gas distribution assembly of claim 1 arranged between the processing chamber and the coil.

16. The substrate processing system of claim 15, wherein N=2.

17. The substrate processing system of claim 15, wherein:

each of the N inner rings includes C circumferential portions, where C is an integer greater than one; and each of the C circumferential portions includes a body having a first arcuate portion and a second arcuate portion, wherein the first arcuate portion is radially and circumferentially offset relative the second arcuate portion.

18. The substrate processing system of claim 17, wherein C=2.

19. The gas distribution assembly comprising of claim 1, wherein the outer ring, the N inner rings, and the center portion are formed of dielectric material.

20. The gas distribution assembly of claim 1, wherein:

the gas distribution plate is absent O-rings at the inner stepped interfaces and at the outer stepped interfaces of the N inner rings; and the gas distribution plate comprises an O-ring disposed between the top plate and the outer ring.

21. A gas distribution assembly for a substrate processing system, the gas distribution assembly comprising:

a top plate; and a gas distribution plate comprising an outer ring including a stepped interface on a radially inner surface of the outer ring, and at least one segment comprising a radially outer surface and a plurality of gas through holes, wherein the radially outer surface of the at least one segment is configured to rest on and mate with the stepped interface of the outer ring, the top plate and the gas distribution plate are dielectric windows, the top plate is disposed on the gas distribution plate, and a gap exists between the top plate and the gas distribution plate for passage of gas to the plurality of gas through holes in the at least one segment.

22. The gas distribution assembly of claim 1, wherein the top plate comprises at least one of alumina and aluminum nitride.

23. The gas distribution assembly of claim 1, wherein:

one of the N inner rings is segmented and comprises a plurality of distinct segments; and the plurality of distinct segments of the one of the N inner rings are arranged azimuthally relative to each other to form an annularly-shaped ring.

24. The gas distribution assembly of claim 1, wherein:

each of the N inner rings is segmented and comprises a plurality of distinct segments; and the plurality of distinct segments of each of the N inner rings are arranged azimuthally relative to each other to form an annularly-shaped ring.

25. The gas distribution assembly of claim 5, wherein the first ring segment and the second ring segment are respective half-rings.

26. The gas distribution assembly of claim 5, wherein the first ring segment and the second ring segment of each of the C circumferential portions has a rectangular-shaped cross-section.

27. The gas distribution assembly of claim 1, wherein:

the top plate comprises a plenum located at a center of the top plate and having at least one gas hole;

the plenum is configured to receive gas for passage through the at least one gas hole; and a gap exists between the top plate and the gas distribution plate for distribution of the gas between i) the at least one gas hole and ii) a plurality of gas holes in one or more of the at least one of the N inner rings.

28. The gas distribution assembly of claim 27, wherein the gas is distributed through the plurality of gas holes in the one or more of the at least one of the N inner rings and not between the outer ring, the N inner rings and the center portion.

* * * * *